(12) United States Patent
Fujita

(10) Patent No.: US 7,727,642 B2
(45) Date of Patent: Jun. 1, 2010

(54) COMPOUND FOR ORGANIC ELECTROLUMINESCENCE AND ORGANIC ELECTROLUMINESCENT DEVICE

(75) Inventor: Tetsuji Fujita, Chino (JP)

(73) Assignee: Seiko Epson Corporation, Tokyo (JP)

( * ) Notice: Subject to any disclaimer, the term of this patent is extended or adjusted under 35 U.S.C. 154(b) by 588 days.

(21) Appl. No.: 11/689,172

(22) Filed: Mar. 21, 2007

(65) Prior Publication Data

US 2007/0244295 A1    Oct. 18, 2007

(30) Foreign Application Priority Data

Apr. 13, 2006    (JP) .............................. 2006-110757

(51) Int. Cl.
*H01L 51/54*    (2006.01)
*C09K 11/06*    (2006.01)

(52) U.S. Cl. .................. 428/690; 428/917; 313/504; 313/506; 528/422; 528/394; 528/397; 257/40

(58) Field of Classification Search ........................ None
See application file for complete search history.

(56) References Cited

FOREIGN PATENT DOCUMENTS

EP    1 298 117 A2    4/2003

(Continued)

OTHER PUBLICATIONS

Li, Tingxi et al., "Synthesis and Electroluminescence Properties of Fluorene Containing Arylamine Oligomer," Polymers for Advanced Technologies, vol. 15, pp. 266-269 (2004).

(Continued)

*Primary Examiner*—Dawn Garrett
(74) *Attorney, Agent, or Firm*—Oliff & Berridge, PLC

(57) ABSTRACT

A compound for organic electroluminescence includes a polymer molecule having molecules shown in Formulae 1 to 5 as constituent units:

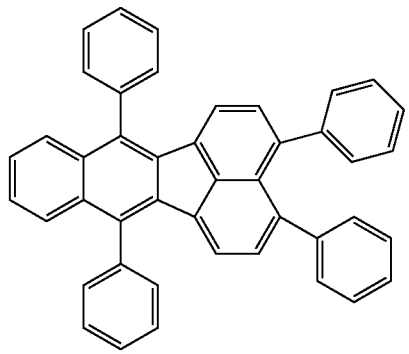

(1)

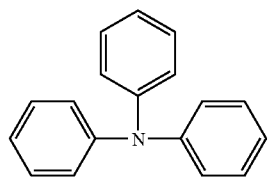

(2)

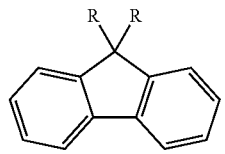

(3)

wherein R is an alkyl group, an aryl group, or an alkylaryl group,

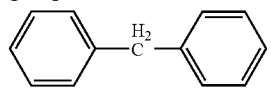

(4)

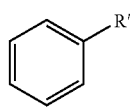

(5)

wherein R' is hydrogen, an alkyl group, or an alkylaryl group.

12 Claims, 11 Drawing Sheets

FOREIGN PATENT DOCUMENTS

| | | |
|---|---|---|
| JP | A 2000-323276 | 11/2000 |
| JP | A 2002-536492 | 10/2002 |
| JP | A 2003-026616 | 1/2003 |
| JP | A 2004-002351 | 1/2004 |
| JP | A 2005-053806 | 3/2005 |

OTHER PUBLICATIONS

Edelmann, Michael J. et al., "Dramatically Enhanced Fluorescence of Heteroaromatic Chromophores Upon Insertion as Spacers into Oligo(Triacetylene)s," Helvetica Chimica Acta, vol. 85, pp. 2195-2213 (2002).

Obrey, Stephen J. et al., "Aluminum Alkoxides as Synthons for Methylalumoxane (MAO): Product-Catalyzed Thermal Decomposition of $[Me_2Al(\mu\text{-}OCPh_3)]_2$," Organometallics, vol. 20, pp. 5162-5170 (2001).

Saroja, Ginagunta et al., "Synthesis of Alkylated Aminofluorenes by Palladium-Catalyzed Substitution at Halofluorenes," Journal of Organic Chemistry, vol. 69, pp. 987-990 (2004).

Hreha, Richard D. et al., "2,7-Bis(diarylamino)-9,9-dimethylfluorenes as Hole-Transport Materials for Orangic Light-Emitting Diodes," Advanced Functional Materials, vol. 13, No. 12, pp. 967-973 (Dec. 2003).

Mitchell, Reginald H. et al., "Straining Strained Molecules. III. The Spectral and Mutagenic Properties and an Alternate Synthesis of Diaceperylene and Dicyclopenta[1,2,3-cd:1',2',3'lm]perlene," Canadian Journal of Chemistry, vol. 70, pp. 1015-1021 (1992).

Oida, Tatsuo et al., "A New Synthesis of 1,3-Diarylisobenzofurans," Synthesis, vol. 2, pp. 131-133 (Feb. 1980).

Debad, Jeff D. et al., "Anodic Coupling of Diphenylbenzo[k]Fluoranthene: Mechanistic and Kinetic Studies Utilizing Cyclic Voltammetry and Electrogenerated Chemiluminescence," Journal of Organic Chemistry, vol. 62, pp. 530-537 (1997).

[INTERMEDIATE] ISOMER IS PRESENT

EL WAVEFORM OF EXAMPLE 1
(THE SAME WAVEFORM IS SHOWN IN EXAMPLES 3 AND 5)

EL WAVEFORM OF EXAMPLE 2
(THE SAME WAVEFORM IS SHOWN IN EXAMPLES 4 AND 6)

LUMINESCENCE WAVEFORM OF HOST 1
(COMPARATIVE EXAMPLE 1)

LUMINESCENCE WAVEFORM OF HOST 2
(COMPARATIVE EXAMPLE 2)

LUMINESCENCE WAVEFORM OF HOST 3
(COMPARATIVE EXAMPLE 3)

COMPOUND FOR ORGANIC ELECTROLUMINESCENCE AND ORGANIC ELECTROLUMINESCENT DEVICE

BACKGROUND

1. Technical Field

The present invention relates to an organic EL device applied to displays or display light sources, and more particularly, to a compound for organic EL desirably applied to a coating type organic EL device and to an organic EL device using the same.

2. Related Art

Recently, the development of organic electro-luminescent devices (organic EL devices) using an organic electroluminescent element (organic EL element) which serves as a self-emission display for replacing a liquid crystal display has accelerated. With respect to such an organic EL device and a method of producing the organic EL device, JP-A-2000-323276 and JP-T-2002-536492 are examples of the related art.

A process where a host material and a light emitting dopant are used as a material of a light emitting layer is applied to a known organic EL device (organic EL apparatus) so as to assure high efficiency of light emission, a change in the color of emitted light, and a long life span. The process is frequently applied to organic EL devices including an organic material provided using deposition, but not to polymer-coated organic EL devices which include a layer formed using an ink jet process (liquid droplet ejecting process) or a spin coating process.

In connection with this, the terms 'host material and light emitting dopant' have the following meanings. (1) The host material is capable of providing both holes and electrons.

(2) In the organic EL device that includes the light emitting layer having no light emitting dopant, it is observed that light is emitted from the host material. However, if the light emitting layer has both the light emitting dopant and the host material, it is difficult to observe light emitted from the host material, however, emission of light is observed from the light emitting dopant.

(3) The EL spectrum that is observed for the EL element including both the host material and the light emitting dopant is that of fluorescence or phosphorescence emitted from the luminous center of the light emitting dopant. The luminous center is a portion of the light emitting dopant which is an organic molecular skeleton capable of emitting strong fluorescence/phosphorescence.

The reason (problem) why both the host material and the light emitting dopant are not frequently applied to the polymer-coated organic EL devices is as follows.

(1) When a solution containing the host and the light emitting dopant is applied, bleeding of the light emitting dopant may occur. The reason for this is that, if the solution of materials having a low molecular weight is applied to the polymer and dried, the materials having a low molecular weight flow out from the surface layer during the drying.

(2) The light emitting dopant material has poor hole/electron trapping ability. When the host material is a conjugated polymer, the trapping ability is very poor. In such a conjugated polymer, it is believed that since the holes and the electrons preferentially flow through the host polymer molecule, it is difficult for the light emitting dopant to trap the holes and the electrons.

(3) The development of the light emitting dopant material is time-consuming. The reason for this is that the system used for applying the host and light emitting dopant is inefficient in the polymer-coated organic EL device field in comparison with the deposition type EL (low-molecular-weight EL).

SUMMARY

An advantage of some aspects of the invention is that it provides a compound for organic EL that contains a host material and a light emitting dopant constituting a light emitting layer so that high efficiency of light emission and a long life span are assured, and an organic EL device using the same.

The inventor has conducted studies to achieve the above advantage, and the results are as follows.

With respect to the above problem (1), the following solution may be provided. The light emitting dopant may be polymerized to prevent bleeding of the light emitting dopant during the coating/drying. It is preferable that the dopant have π conjugation (typical π conjugation and conjugation having N atoms). However, in the coat type of organic EL, it is necessary to dissolve the dopant in a predetermined solvent. Thus, the polymerization may be performed using a non-conjugation connection group having a predetermined molecular weight according to the type of design.

With respect to the above problem (2), the following solution may be provided.

In the molecule design, a functional group that is preferentially capable of trapping holes or electrons is added to the molecule of the light emitting dopant during the polymerization disclosed in the problem (1) to improve the ability of the dopant. Particularly, the functional group having the hole trapping ability is added to the molecule to improve the ability of the dopant.

Preferably, the luminous center and the functional group having the hole trapping ability of the light emitting dopant are connected through the π conjugation system. Through the π conjugation, the direct hole trapping of the luminous center is assured.

The IP (ionization potential) of the host material is the criterion for hole trapping ability improvement. In connection with this, it is required that ease of oxidation is better with respect to the host material.

Based on the above description, the inventor accomplished the invention.

According to an aspect of the invention, a compound for organic EL includes a polymer molecule having molecules shown in Formulae 1 to 5 as constituent units:

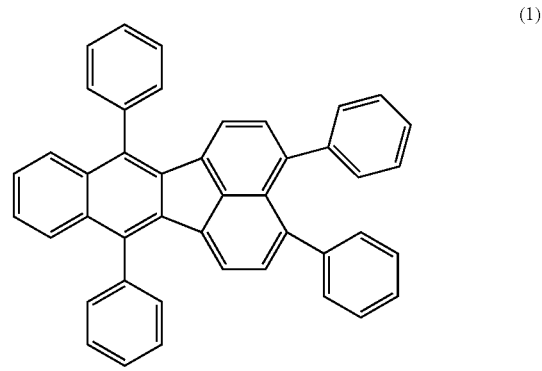

(1)

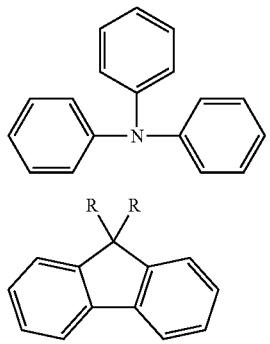
(2)

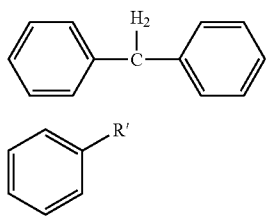
(3)

wherein R is an alkyl group, an aryl group, or an alkylaryl group, (4)

(5)

wherein R' is hydrogen, an alkyl group, or an alkylaryl group.

In the polymer molecule, the molecule of Formula 1 acts as a molecular unit that emits blue light, the molecule of Formula 2 acts as a hole trapping unit, and the molecules of Formulae 3 and 4 act as connection units for polymerization in the organic EL device. The molecule of Formula 3 also acts as an electron trapping unit and slightly controls the amount of electrons flowing through the light emitting layer. The molecule of Formula 5 is a functional group that is used to prevent a halogen element from being provided to an end of the molecule.

Since the polymer molecule is capable of trapping the holes, the polymer molecule is applied to the light emitting layer of the organic EL device to trap the holes flowing through the light emitting layer, thereby generating cations. The cations trap the electrons flowing through the light emitting layer, causing recombination in the polymer molecule. Accordingly, the molecular unit of Formula 1 that is the light emitting unit creates electroluminescence.

The term 'recombination' means that the molecule of the luminous center is in the excitation state due to the holes and the electrons trapped by the polymer molecule.

That is, energy that is generated in the course of converting 'the excitation state' into 'the ground state' is observed in an electroluminescent form.

Therefore, the polymer molecule is applied to the organic EL device to very efficiently emit cyan light for a long time.

In the compound for organic EL according to the above-mentioned aspect, it is preferable that the polymer molecule be expressed by Formula 6 in the organic EL compound:

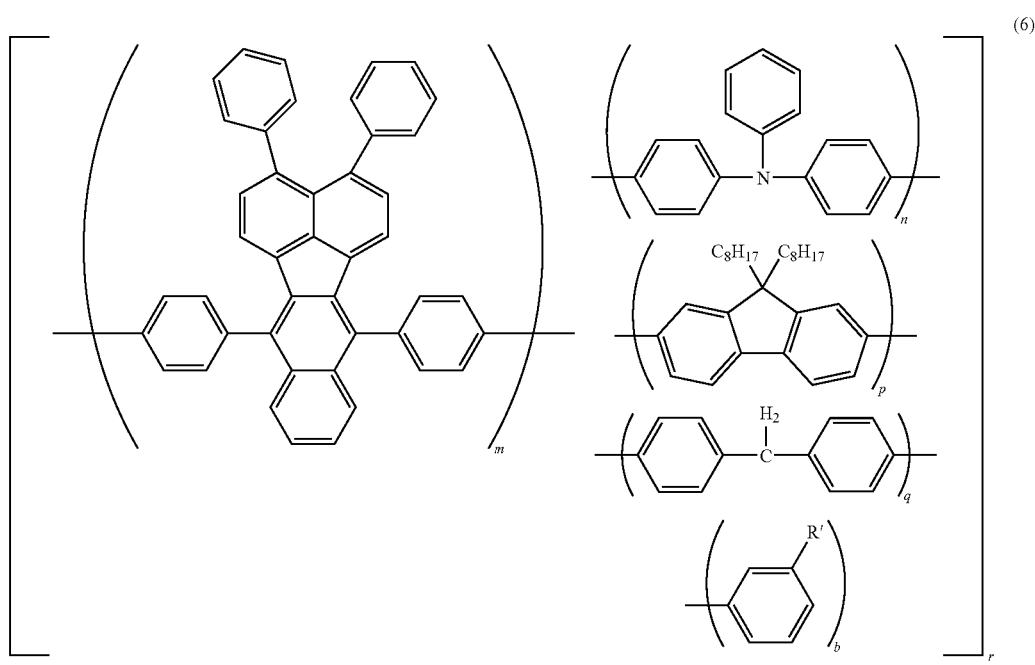
(6)

In Formula 6, R is an alkyl group, an aryl group, or an alkylaryl group, R' is hydrogen, an alkyl group, or an alkylaryl group, m, n, and p each are an integer of 1 or more, q and b each are an integer of 0 or more, and r is an integer of 1 or more.

As described above, the polymer molecule is applied to the organic EL device to very efficiently emit cyan light for a long time.

In Formula 6, r is an integer denoting the degree of polymerization of the oligomer unit constituting the polymer molecule (the smallest unit including the molecules of Formulae 1 to 5).

Additionally, it is preferable that q be 0 in Formula 6. However, since solubility is reduced according to the type of solvent of the ink for coating or according to q and r, q may be an integer of 1 to 4.

In the organic EL compound according to the above-mentioned aspect, m that is the integer denoting the number of light emitting units of Formula 1 is preferably 1 or 2 in an oligomer unit of Formula 6.

The oligomer has r of 1 in Formula 6. Accordingly, it is possible to assure desirable EL luminance in the design of the oligomer molecule.

In the organic EL compound according to the above-mentioned aspect, n that is the integer denoting the number of units having a hole trapping ability of Formula 2 is preferably 2 or more in the oligomer unit of Formula 6.

It is possible to assure desirable EL luminance in molecular design of the oligomer unit.

In the organic EL compound according to the above-mentioned aspect, p that is the integer denoting the number of connection units for polymerization having an electron trapping ability of Formula 3 is preferably 1 to 4 in the oligomer unit of Formula 6.

It is possible to improve the solubility to the solvent in molecular design of the oligomer unit. Additionally, it is possible to control the flow of the electrons and to optimize light emission efficiency.

In the organic EL compound according to the above-mentioned aspect; it is preferable that the unit of Formula 1 and the unit of Formula 2 be directly connected to each other at one point or more in the oligomer unit of Formula 6.

It is possible to improve the hole trapping ability, light emission efficiency, and a half-life of luminance in molecular design of the oligomer unit.

According to another aspect of the invention, an organic EL device includes the compound for organic EL.

The compound for organic EL is used to produce the desirable organic EL device.

According to still another aspect of the invention, an organic EL device includes the compound for organic EL applied to a light emitting layer.

The compound for organic EL is applied to the light emitting layer to provide desirable characteristics of the material. Thus, it is possible to produce the device including desirable light emission efficiency and half-life of luminance.

According to yet another aspect of the invention, an organic EL device includes the compound for organic EL used as a light emitting dopant material of a light emitting layer.

The light emitting layer creates electroluminescence when voltage is applied to the organic EL, device and an electric current flows. In the coat type of organic EL device, the number of materials constituting the light emitting layer is typically 1. The light emitting layer has three abilities of injection and transportation of the electrons and the holes and creation of electroluminescence.

The term 'light emitting dopant' is used when the dopant is applied to the light emitting layer and mainly provides the light emitting ability among the three abilities. When the dopant mainly provides the light emitting ability, the organic material that is used for the main purpose of injecting and transporting the holes and the electrons is used along with the dopant. The organic material is called a host material.

Since the compound for organic EL is used as the light emitting dopant material of the light emitting layer, desirable characteristics of the material are provided, and it is possible to produce the desirable device that has a cyan light emitting ability and the desirable light emission efficiency and half-life of luminance.

In the organic EL device according to the above-mentioned aspect, preferably, the light emitting layer is formed of the light emitting dopant material and the host material. Preferably, the light emitting dopant material and the host material are included in the light emitting layer so that k shown in Equation 7 is 0.5 to 10.0 percent by weight:

$$k=(a/(b+c))\times 100. \qquad \text{Equation 7}$$

In Equation 7, a is the weight of the unit of Formula 1 of the light emitting dopant material, b is the weight of the light emitting dopant material, and c is the weight of the host material.

The luminous portion of the light emitting dopant (Formula 1 of the light emitting dopant material) has high intensity of fluorescence. Accordingly, if the light emitting dopant efficiently traps the electrons and the holes in the device (element), even though k is about 0.1 percent by weight, it is possible to create electroluminescence. However, if k is very low, undesirably, the host material emits light due to poor transfer of energy or undesirable trapping of the electrons and the holes. Therefore, it is preferable that the lowest limit of k be 0.5 percent by weight. It is difficult to set the highest limit. In connection with this, if only the light emitting ability of the light emitting dopant is required, the highest limit may be 20 to 30 percent by weight. However, if the amount is very high, it is impossible to create desirable electroluminescence due to concentration quenching. Accordingly, it is preferable that the highest limit be 10 percent by weight in consideration of light emission efficiency.

In the organic EL device according to the above-mentioned aspect, preferably, the light emitting layer is formed of the light emitting dopant material and the host material. Preferably, the host material is a homopolymer or a copolymer having at least one material selected from fluorene, arylamine, or anthracene.

It is required that the host material is capable of desirably transporting the holes and the electrons. It is also required that an energy gap between the HOMO (highest occupied molecular orbital) and the LUMO (lowest unoccupied molecular orbital) in a molecular orbital is higher in comparison with the unit of Formula 1 of the polymer molecule. Additionally, it is required that a vacuum level of the LUMO (lowest unoccupied molecular orbital) is higher in comparison with the polymer of Formula 6.

When the above-mentioned requirements are satisfied, both the holes and the electrons are desirably injected from the host material to the light emitting dopant to improve light emitting efficiency and a life span.

In the organic EL device according to the above-mentioned aspect, preferably, at least one hole injection or hole transport layer is formed between the light emitting layer and the anode.

Thereby, the injection of the holes to the light emitting layer and the light emitting efficiency are improved.

The HOMO (highest occupied molecular orbital) may be measured using photoelectrons spectroscopy equipment (AC-1 manufactured by RIKEN KEIKI Co., Ltd.

The energy gap between the HOMO (highest occupied molecular orbital) and the LUMO (lowest unoccupied molecular orbital) may be measured using thin film absorption spectrum of the host material. Typically, the energy gap is obtained using the absorption edge at the longest wavelength of the absorption spectrum. The vacuum level of the LUMO may be obtained using a simpler process in comparison with the vacuum level of the HOMO and the gap between the HOMO and the LUMO.

In the organic EL device according to the above-mentioned aspect, preferably, the light emitting layer is formed through coating using a spin coating process or a liquid droplet ejecting process.

As described above, the compound for organic EL is applied using the spin coating process or the liquid droplet ejecting process to produce the light emitting layer, thus the organic EL device has the desirable light emission efficiency and half-life of luminance.

Since the compound for organic EL is the oligomer or polymer molecule, the compatibility of the host material to the polymer is desirable. Accordingly, it is possible to uniformly disperse the host material and the light emitting dopant material in the light emitting layer.

Since the compound for organic EL has a high molecular weight, a portion or all of the compound is decomposed during the deposition in a deposition film forming process, thus reducing the characteristics of the organic EL device.

BRIEF DESCRIPTION OF THE DRAWINGS

The invention will be described with reference to the accompany rig drawings, wherein like numbers refer like elements.

DESCRIPTION OF EXEMPLARY EMBODIMENTS

Hereinafter, exemplary embodiments of the invention will be described in detail.

First, a description will be given of compounds for organic EL according to embodiments of the invention based on synthesis examples.

Compound for Organic EL

The polymer molecule shown in Formula 8 was produced as a compound for organic EL according to a first embodiment of the invention using synthesis processes of the following synthesis examples:

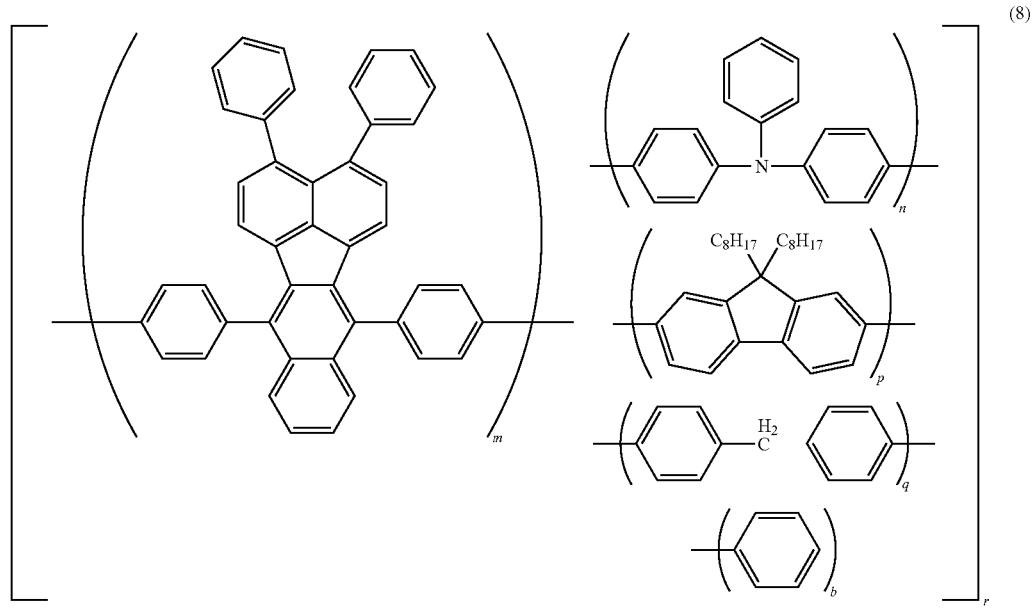

(8)

In Formula 8, with respect to theoretical values of the synthetic reaction, m=1, n=2, p=4, q=0, b=2, and r=1.

SYNTHESIS EXAMPLE 1

Figure 1:
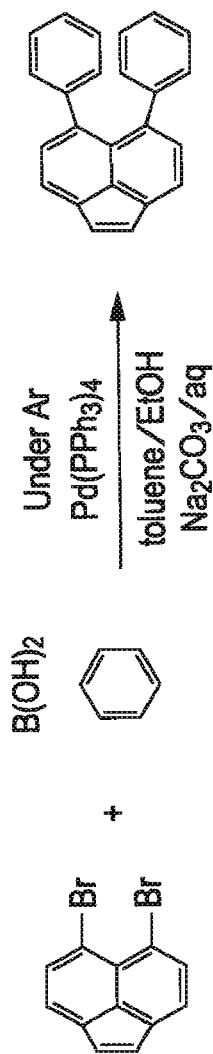
FIG. 1 illustrates the synthesis of synthesis example 1.

5,6-diphenyl acenaphthylene (intermediate) was synthesized using a the synthesis process of FIG. 1. The synthesis procedure was as follows.

First, 5 g of 5,6-dibromoacenaphthylene (1.61E-2 mol) and 4.13 g of commercial phenyl borate (3.4E-2 mol) were weighed and put into a 200 cm$^3$ Schlenk tube under Ar. Next, 50 cm$^3$ of distilled ethanol and 100 cm$^3$ of distilled toluene were added to produce a solution. Additionally, 1.1 g of a tetrakistriphenylphosphinepalladium complex (Pd(PPh$_3$)$_4$) and 30 cm$^3$ of saturated sodium carbonate aqueous solution were added, and the reaction was performed at 80° C. for 10 hours.

After the reaction, the reaction solution was cooled to room temperature, transferred to a separatory funnel with a volume of 1 liter to perform extraction using toluene, and desirably washed with distilled water. The toluene layer in the separatory funnel was desirably dried using magnesium sulfate, and then purified using silica gel chromatography and reprecipitation.

The solvent mixture of hexane and toluene was used as the developing solvent for the silica gel chromatography. Dichloromethane/hexane was used as the solvent that was used to perform the purification using reprecipitation.

Thereby, 3 g of yellow solid was produced (the yield meant the recovery amount was 60%). Furthermore, MS$^+$ of 304 was confirmed.

SYNTHESIS EXAMPLE 2

Figure 2:
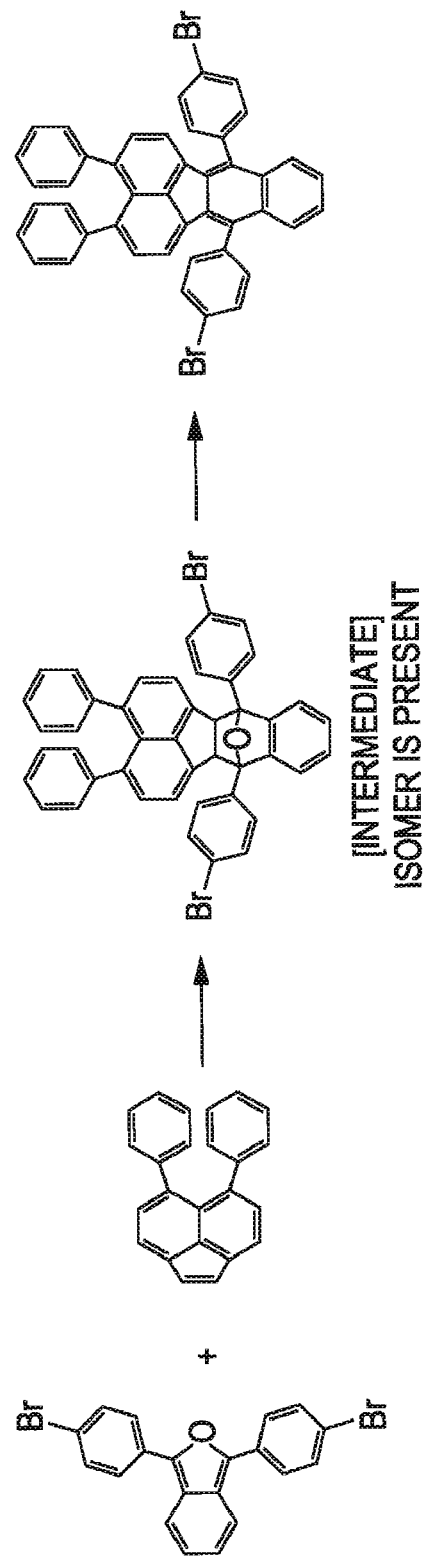
FIG. 2 illustrates the synthesis of synthesis example 2.

3,4,7,12-tetraphenylbenzo[k]fluoranthene derivative was synthesized using the synthesis process of FIG. 2. The synthesis procedure was as follows.

First, 3 g of 5,6-diphenyl acenaphthylene (9.9E-3 mol) and 4.2 g of 1,3-bis(4-bromophenyl)isobenzofuran (9.9E-3 mol) were weighed and put into a 200 cm$^3$ Schlenk tube under Ar. Subsequently, 100 cm$^3$ of xylene that was dried by distillation using the solvent was added, and the reaction was performed at 130° C. for 24 hours.

After the reaction, the target intermediate was extracted with chloroform. Purification was performed using silica gel chromatography and reprecipitation. In the silica gel chromatography, toluene was used as the developing solvent. During the purification using the reprecipitation, dichloromethane and hexane were used as the solvent.

Thereby, 3.2 g of white solid was produced as the intermediate (yield: 44%).

Subsequently, 3 g of the intermediate was put into a flask with a volume of 500 cm$^3$, 200 cm$^3$ of an acetic acid was added, and the resulting substance was heated at 130° C. for 1 hour. After the heating, the temperature was reduced to 100° C., and 30 cm$^3$ of 48% HBr aqueous solution was added. Water was added 30 minutes after the heating to enable collection of solids.

The solids were desirably washed with distilled water and methanol, and the target substance was separated and purified using silica gel chromatography and reprecipitation. In the silica gel chromatography, the solvent mixture of toluene and hexane was used as the developing solvent. During the reprecipitation, dichloromethane and hexane were used as the solvent.

Thereby, 2.2 g of black purple solid was produced (yield: 76%). Furthermore, M$^+$ of 714 was confirmed.

SYNTHESIS EXAMPLE 3

Figure 3:
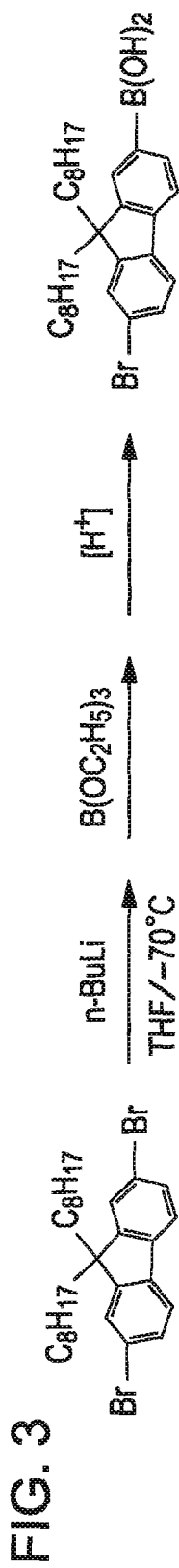
FIG. 3 illustrates the synthesis of synthesis example 3.

2-bromo-9,9-di-n-octylfluorenyl-7-borate was synthesized using the synthesis process of FIG. 3. The synthesis procedure was as follows.

First, 4 g of 2,7-dibromo-9,9-di-n-octylfluorene (7.3E-3 mol) and 100 cm$^3$ of THF that was subjected to sodium drying were put into a 200 cm$^3$ Schlenk tube under Ar to produce a solution. The solution was cooled to −70° C. 1.5 mol/l of n-butyllithium hexane solution was added in the amount of 4.9 cm$^3$, and left for 1 hour. 1.1 g of triethyl borate (7.5E-3 mol) was added while the temperature was maintained, and the reaction was performed for 1.5 hours. After the reaction, 5 cm$^3$ of 40% HCl aqueous solution was added to the reaction solution at 5° C. After 1 hour, neutralization was performed using the saturated sodium carbonate aqueous solution so that the pH was 7.

The organic layer (THF layer) was separated using a separatory funnel. A predetermined amount of magnesium sulfate was added to the separated THF solution to remove the moisture. After magnesium sulfate was removed using filter paper, hexane was added to precipitate the target substance. Purification was performed using reprecipitation. THF and hexane were used as the solvent.

SYNTHESIS EXAMPLE 4

Figure 4:
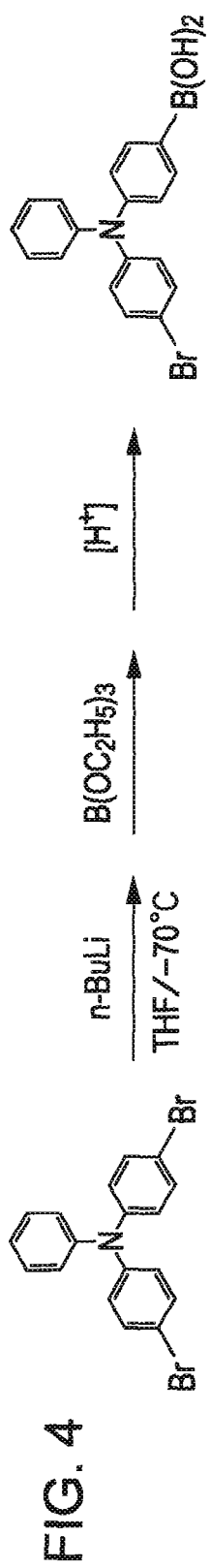
FIG. 4 illustrates the synthesis of synthesis example 4.

4-bromo-triphenyl aminoborate was synthesized using the synthesis process of FIG. 4. The synthesis procedure was as follows.

First, 4 g of commercially available 4,4'-dibromo-triphenylamine (9.9E-3 mol) and 100 cm$^3$ of THF that had been subjected to sodium drying were put into a 200 cm$^3$ Schlenk tube under Ar to produce a solution. The solution was then cooled to −70° C. 1.5 mol/l of n-butyllithium hexane solution (1.48E-2 mol) was added in the amount of 9.9 cm$^3$, and left for 1 hour. Subsequently, 1.9 g of triethyl borate (1.3E-2 mol) was added while the temperature was maintained, and the reaction was performed for 1.5 hours. After the reaction, 5 cm$^3$ of 40% HCl aqueous solution was added to the reaction solution at 5° C. After 1 hour, neutralization was performed using the saturated sodium carbonate aqueous solution so that the pH was 7.

The organic layer (THF layer) was separated using a separatory funnel. Subsequently, a predetermined amount of magnesium sulfate was added to the separated THF solution to remove the moisture. After magnesium sulfate was removed using filter paper, hexane was added to precipitate the target substance. Purification was performed using reprecipitation. THF and hexane were used as the solvent.

Thereby, 1.4 g of white solid (to be colored to have a light green color) was produced (yield: 40%).

SYNTHESIS EXAMPLE 5

Figure 5:
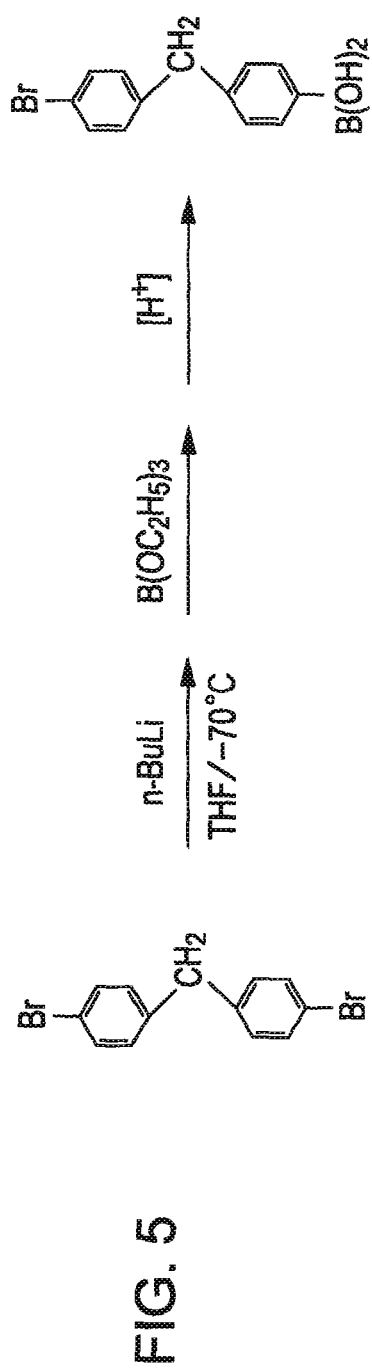
FIG. 5 illustrates the synthesis of synthesis example 5.

1-(4-bromobenzyl)-4-phenyl borate was synthesized using the synthesis process of FIG. 5. The synthesis procedure was as follows.

First, 5 g of commercial 4,4'-bisbromophenylmethane (1.5E-2 mol) and 50 cm$^3$ of THF that had been subjected to sodium drying were put into a 200 cm$^3$ Schlenk tube under Ar to produce a solution. The solution was then cooled to −70° C. 1.5 mol/l of n-butyllithium hexane solution (1.5E-2 mol) was added in the amount of 10.2 cm$^3$, and left for 1 hour. Subsequently, 2.2 g of triethyl borate (1.5E-2 mol) was added while the temperature was maintained, and the reaction was performed for 1.5 hours. After the reaction, 5 cm³ of 40% HCl aqueous solution was added to the reaction solution at 5° C. After 1 hour, neutralization was performed using the saturated sodium carbonate aqueous solution so that the pH was 7.

The organic layer (THF layer) was separated using a separatory funnel. Subsequently, a predetermined amount of magnesium sulfate was added to the separated THF solution to remove the moisture. After magnesium sulfate was removed using filter paper, the solvent was removed using an evaporator.

Thereby, 4 g of transparent viscous substance was produced, and used during the subsequent reaction.

SYNTHESIS EXAMPLE 6

Figure 6:
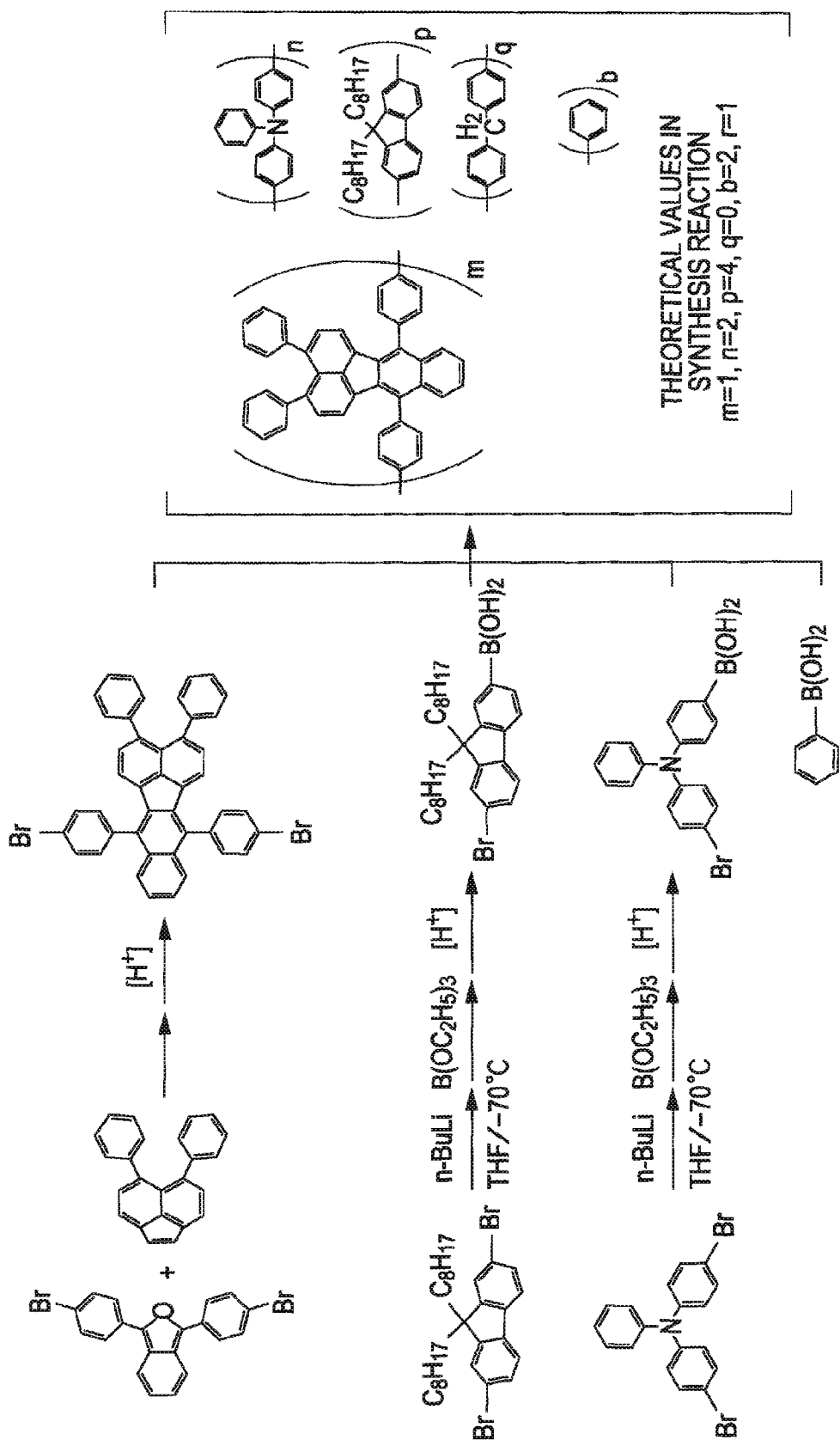
FIG. 6 illustrates the synthesis of synthesis example 6.

The EL material (EL material 1) of Formula 8, that is, the compound for organic EL according to the first embodiment of the invention, was synthesized through the synthesis procedure of FIG. 6 using the synthetic substances produced in synthesis examples 2 to 4.

First, 0.37 g of 3,4,7,12-tetraphenylbenzo[k]fluoranthene derivative (5.2E-mol) and 0.38 g of 4-bromo-triphenyl aminoborate (1.04E-3 mol) which had been produced in advance were put into a 200 cm³ Schlenk tube under Ar, and 50 cm³ of distilled ethanol and 100 cm³ of distilled toluene were added to produce a solution. Additionally, 0.06 g of a tetrakistriphenylphosphineoalladium complex (Pd(PPh₃)₄) and 30 cm³ of saturated sodium carbonate aqueous solution were added, and heated at 80° C. After 1 hour, 1.1 g of 2-bromo-9,9-di-n-octylfluorenyl-7-borate (2.1E-3 mol) and 0.06 g of the tetrakistriphenylphosphinepalladium complex (Pd(PPh₃)₄) were added, and the reaction was performed for 5 hours.

Subsequently, 0.12 g of commercial phenyl borate (1.04E-3 mol) was added, and the additional reaction was performed for 5 hours. After the reaction, air was blown onto the reaction solution for 30 minutes while the solution was heated to make the solution bubble.

The reaction solution was cooled to room temperature, transferred to a separatory funnel with a volume of 1 liter to perform extraction using toluene, and desirably washed with distilled water. The toluene layer in the separatory funnel was desirably dried using magnesium sulfate, and then purified using silica gel chromatography and reprecipitation.

The dichloromethane/hexane system and the dichloromethane/methanol system were used as the solvent that was used to perform the purification using reprecipitation.

Thereby, 0.6 g of yellow solid was produced (yield: 43%) (the calculation was performed on the basis of a molecular weight of 2746).

The polymer molecule shown in Formula 9 was produced as the compound for organic EL according to a second embodiment of the invention using the synthesis process of the following synthesis example:

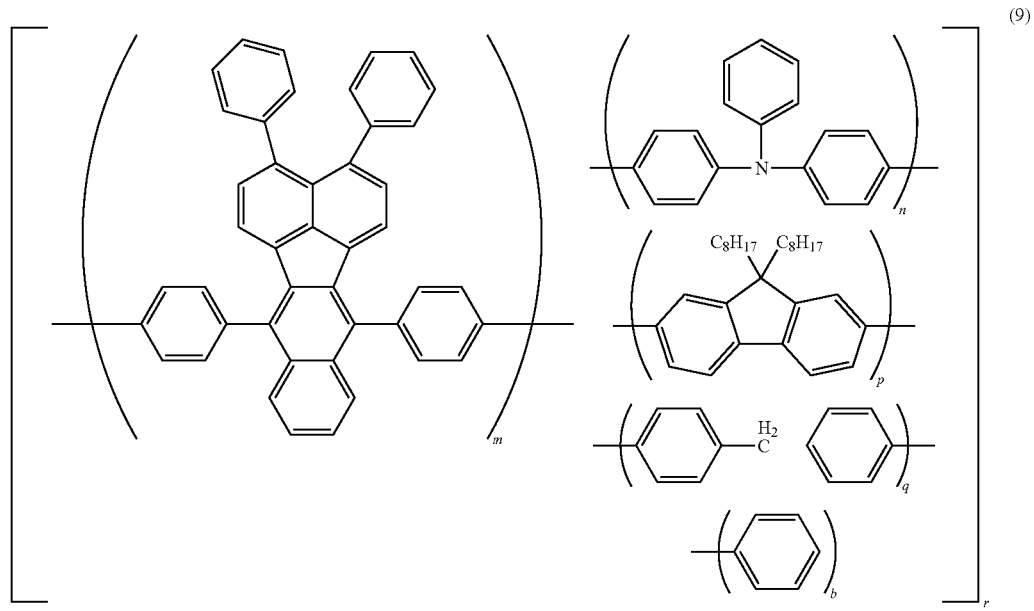

(9)

In Formula 9, with respect to theoretical values of the synthetic reaction, m=1, n=2, p=4, q=2, b=2, and r=1.

SYNTHESIS EXAMPLE 7

Figure 7:
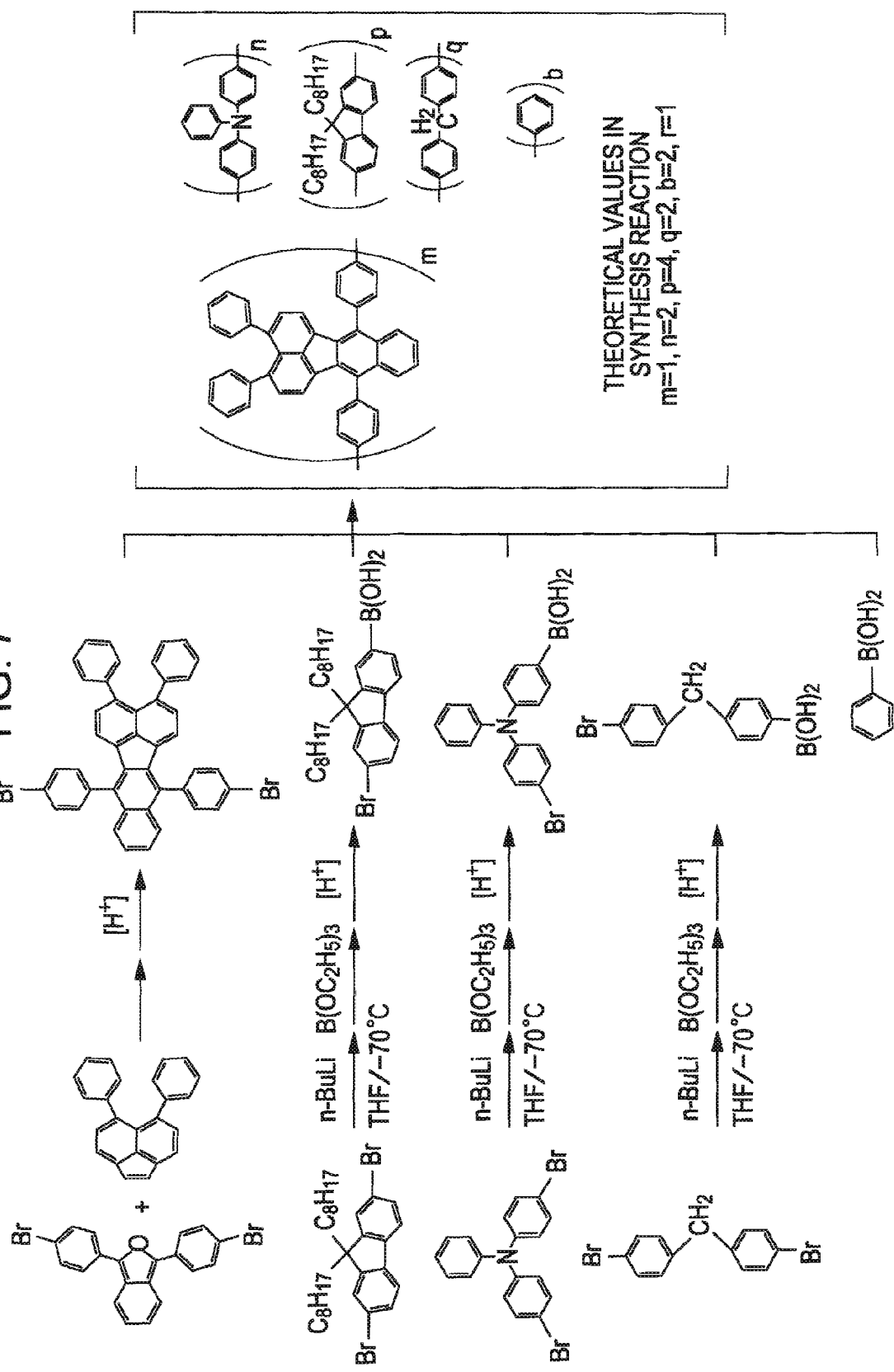
FIG. 7 illustrates the synthesis of synthesis example 7.

The EL material (EL material 2) of Formula 9 was synthesized through the synthesis procedure of FIG. 7 using the synthetic substances produced in synthesis examples 2 to 5.

First, 0.37 g of 3,4,7,12-tetraphenylbenzo[k]fluoranthene derivative (5.2E-mol) and 0.38 g of 4-bromo-triphenyl aminoborate (1.04E-3 mol) which had been produced in advance were put into a 200 cm³ Schlenk tube under Ar, and 50 cm³ of distilled ethanol and 100 cm³ of distilled toluene were added to produce a solution. Additionally, 0.06 g of a tetrakistriphenylphosphinepalladium complex (Pd(PPh₃)₄) and 30 cm³ of saturated sodium carbonate aqueous solution were added, and heated at 80° C. After 1 hour, 0.3 g of 1-(4-bromobenzyl)-4-phenyl borate (1.04E-3 mol) and 0.06 g of the tetrakistriphenylphosphinepalladium complex (Pd(PPh₃)₄) were added, and the reaction was then performed. After 2 hours, 1.1 g of 2-bromo-9,9-di-n-octylfluorenyl-7-borate (2.1E-3 mol) and 0.06 g of the tetrakistriphenylphosphinepalladium complex (Pd(PPh$_3$)$_4$) were further added, and the reaction was performed for 5 hours.

Subsequently, 0.12 g of commercial phenyl borate (1.04E-3 mol) was added, and the additional reaction was performed for 5 hours. After the reaction, air was blown onto the reaction solution for 30 minutes while the solution was heated to make the solution bubble.

The reaction solution was cooled to room temperature, transferred to a separatory funnel with a volume of 1 liter to perform extraction using toluene, and desirably washed with distilled water. The toluene layer in the separatory funnel was desirably dried using magnesium sulfate, and then purified using silica gel chromatography and reprecipitation.

The dichloromethane/hexane system and the dichloromethane/methanol system were used as the solvent that was used to perform the purification using reprecipitation.

saturated sodium carbonate aqueous solution were added, and the reaction was performed at 80° C. for 10 hours.

After the reaction, the reaction solution was cooled to room temperature, transferred to a separatory funnel with a volume of 1 liter to perform extraction using toluene, and desirably washed with distilled water. The toluene layer in the separatory funnel was desirably dried using magnesium sulfate, and then purified using silica gel chromatography and reprecipitation.

The dichloromethane/hexane system and the dichloromethane/methanol system were used as the solvent that was used to perform purification using reprecipitation.

Thereby, 2 g of white solid was produced (the yield meant the recovery amount was 52%).

Next, the polymer molecule of Formula 11 was produced as host 2 through the synthesis procedure of the following synthesis example:

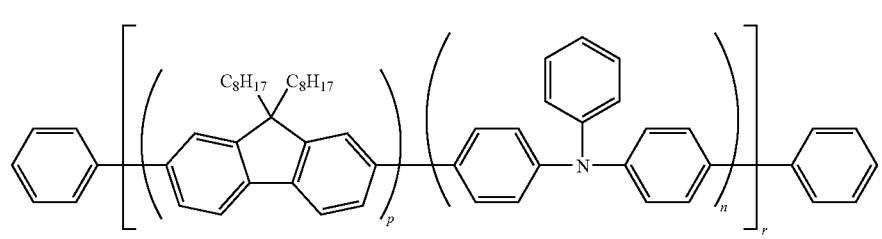

(11)

Thereby, 0.4 g of yellow solid was produced (yield: 25%) (the calculation was performed on the basis of a molecular weight of 3078).

Next, the host material for EL was produced through the following procedure.

First, the polymer molecule shown in Formula 10 was produced as host 1 using the synthesis process of the following synthesis example:

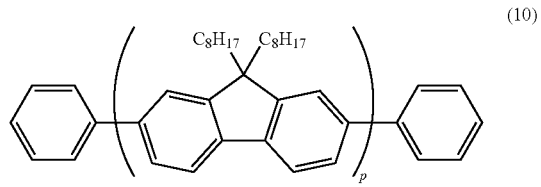

(10)

In Formula 10, with respect to theoretical values of the synthetic reaction, p=150.

SYNTHESIS EXAMPLE 8

Figure 8:
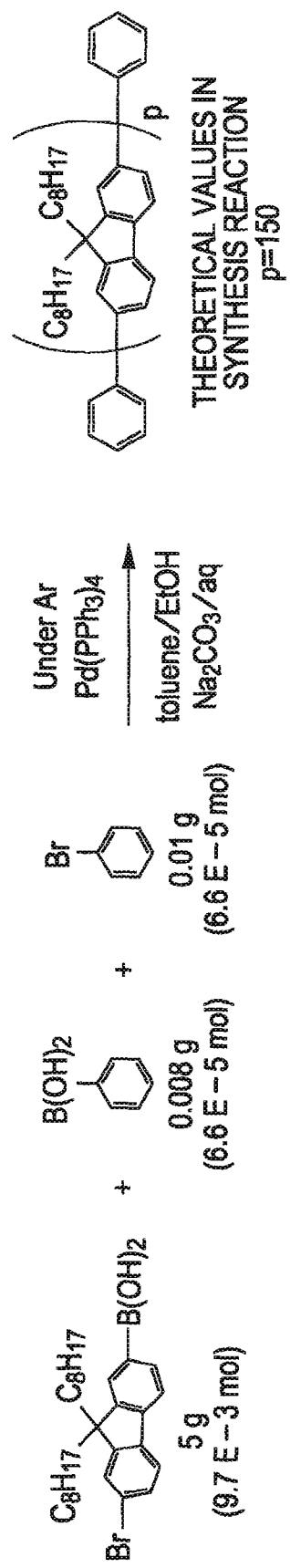
FIG. 8 illustrates the synthesis of synthesis example 8.

Polyfluorene shown in Formula 10 was synthesized as the host material (host 1) for EL through the synthesis procedure of FIG. 8. The synthesis procedure was as follows.

First, 5 g of 2-bromo-9,9-di-n-octylfluorenyl-7-borate (9.7E-3 mol), 0.008 g of commercially available phenyl borate (6.6E-5 mol), and 0.01 g of bromobenzene (6.6E-5 mol) which had been produced in advance were weighed and put into a 200 cm$^3$ Schlenk tube under Ar. 50 cm$^3$ of distilled ethanol and 100 cm$^3$ of distilled toluene were added to produce a solution. Additionally, 0.56 g of a tetrakistriphenylphosphinepalladium complex (Pd(PPh$_3$)$_4$) and 30 cm$^3$ of In Formula 11, with respect to theoretical values of the synthetic reaction, p=3, n=1, and r=50.

SYNTHESIS EXAMPLE 9

Figure 9:
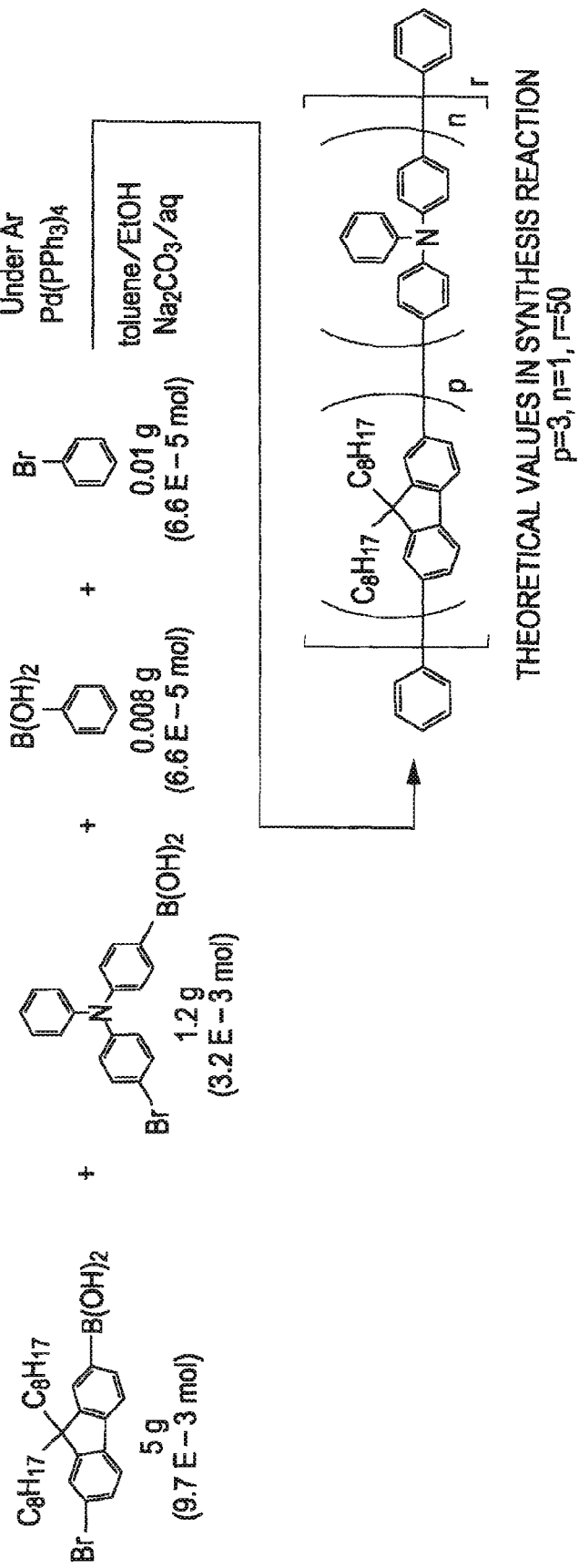
FIG. 9 illustrates the synthesis of synthesis example 9.

The copolymer of fluorene and triphenylamine shorn in Formula 11 was synthesized as the host material (host 2) for EL through the synthesis procedure of FIG. 9. The synthesis procedure was as follows.

First, 5 g of 2-bromo-9,9-di-n-octylfluorenyl-7-borate (9.7E-3 mol), 1.2 g of 4-bromo-triphenyl aminoborate (3.2E-3 mol), 0.008 g of commercially available phenyl borate (6.6E-5 mol), and 0.01 g of bromobenzene (6.6E-5 mol which had been produced in advance were weighed and put into a 200 cm$^3$ Schlenk tube under Ar. 50 cm$^3$ of distilled ethanol and 100 cm$^3$ of distilled toluene were added to produce a solution. Additionally, 0.56 g of a tetrakistriphenylphosphinepalladium complex (Pd(PPh$_3$)$_4$) and 30 cm$^3$ of saturated sodium carbonate aqueous solution were added, and the reaction was performed at 80° C. for 5 hours.

After the reaction, the reaction solution was cooled to room temperature, transferred to a separatory funnel with a volume of 1 liter to perform extraction using toluene, and desirably washed with distilled water. The toluene layer in the separatory funnel was desirably dried using magnesium sulfate, and then purified using silica gel chromatography and reprecipitation. The dichloromethane/hexane system and the dichloromethane/methanol system were used as the solvent that was used to perform purification using reprecipitation.

Thereby, 1.5 g of white solid was produced (the yield meant the recovery amount was 33%).

Next, the polymer molecule of Formula 12 was produced as host 3 through the synthesis procedure of the following synthesis example:

(12)

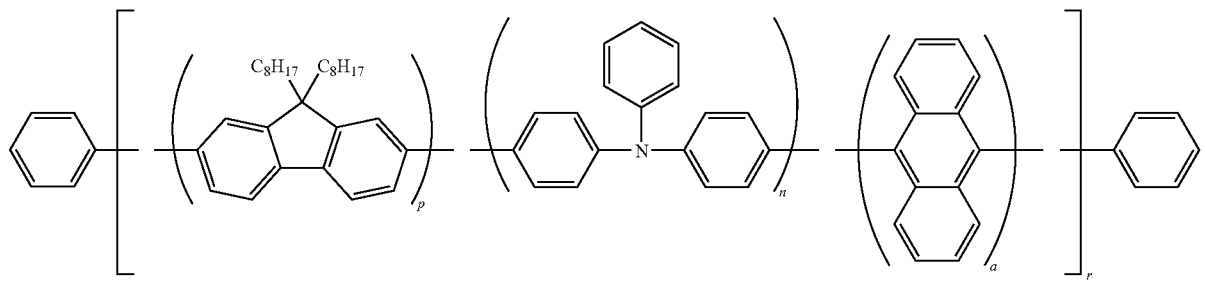

In Formula 12, with respect to theoretical values of the synthetic reaction, p=3, n=1, a=1, and r=50.

SYNTHESIS EXAMPLE 10

Figure 10:
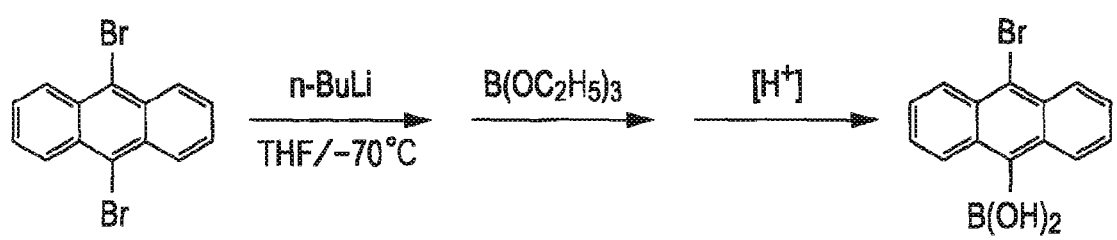
FIG. 10 illustrates the synthesis of synthesis example 10.
Figure 11:
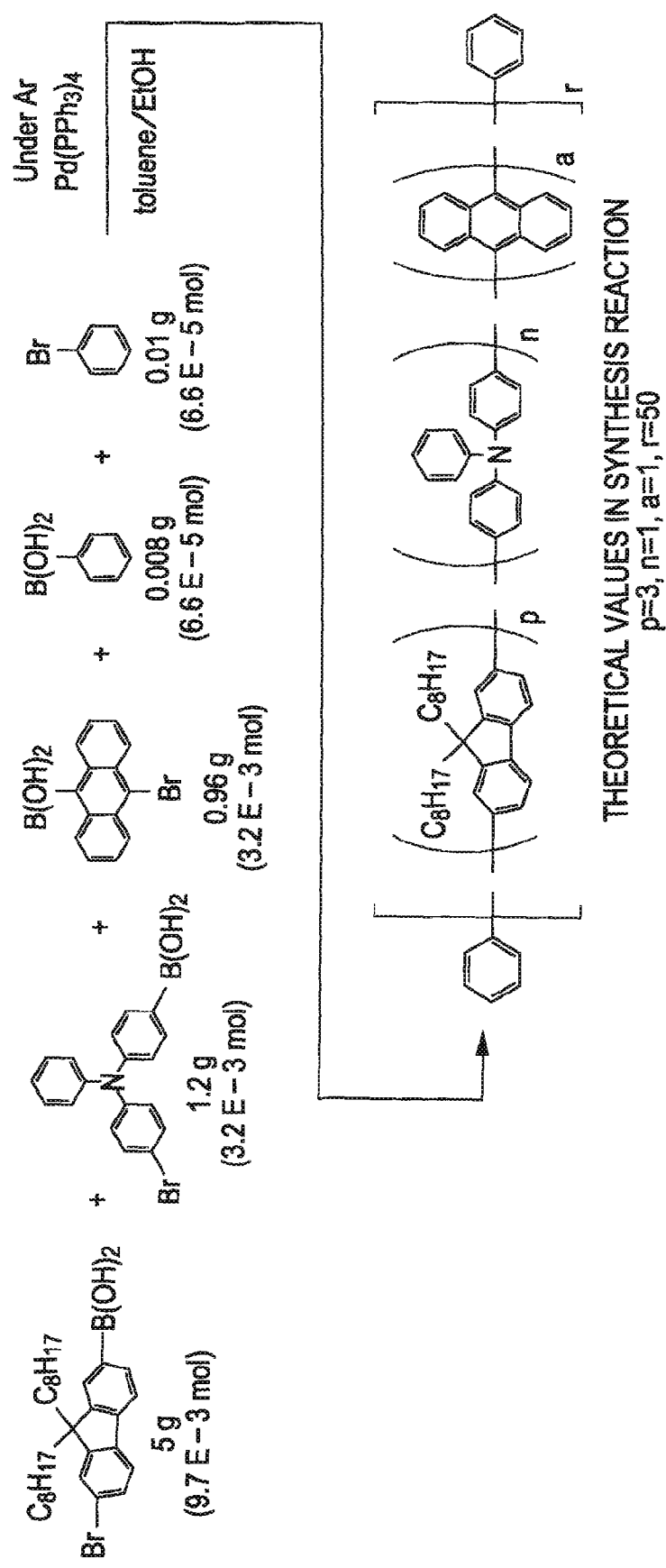
FIG. 11 illustrates the synthesis of synthesis example 10.

The copolymer of fluorene, triphenylamine, and anthracene shown in Formula 12 was synthesized as the host material (host 3) for EL using the process of synthesizing the raw material according to FIG. 10 and the process of synthesizing the host material according to FIG. 11. The synthesis processes were as follows.

Synthesis of the Raw Material: Synthesis of 9-bromoanthracene-10yl-borate

First, 2 g of 9,10-dibromoanthracene (5.9E-3 mol) and 50 cm³ of THF that was subjected to sodium drying were put into a 200 cm³ Schlenk tube under Ar to produce a dispersion solution. The solution was then cooled to −70° C. 1.5 mol/l of n-butyllithium hexane solution (5.9E-3 mol) was added in the amount of 4 cm³, and left for 1 hour. 0.87 g of triethyl borate (5.9E-3 mol) was added while the cooling was maintained, and the reaction was performed for 1.5 hour. After the reaction, 5 cm³ of 40% HCl aqueous solution was added to the reaction solution at 5° C. After 1 hour, 100 cm³ of THF was added to completely dissolve the resulting solution, and the neutralization was then performed using the saturated sodium carbonate aqueous solution so that the pH was 7.

The organic layer (THF layer) was separated using a separatory funnel. A predetermined amount of magnesium sulfate was added to the separated THF solution to remove the moisture. After magnesium sulfate was removed using the filter paper, the solvent was removed using the evaporator, and hexane was added to precipitate the target substance. The purification was performed using the reprecipitation. THF and hexane were used as the solvent.

Thereby, 1 g of light yellow white solid (to be colored to have a light green color) was produced (yield: 56%).

Synthesis of the Host Material

First, 5 g of 2-bromo-9,9-di-n-octylfluorenyl-7-borate (9.7E-3 mol), 1.2 g of 4-bromo-triphenyl aminoborate (3.2E-3 mol), 0.96 g of 9-bromoanthracene-10 yl-borate (3.2E-3 mol), 0.008 g of commercial phenyl borate (6.6E-5 mol), and 0.01 g of bromobenzene (6.6E-5 mol) which had been produced in advance were weighed and put into a 200 cm³ Schlenk tube under Ar. 50 cm³ of distilled ethanol and 100 cm³ of distilled toluene were added to produce a solution. Additionally, 0.7 g of a tetrakistriphenylphosphinepalladium complex (Pd(PPh₃)₄) and 30 cm³ of saturated sodium carbonate aqueous solution were added, and the reaction was performed at 80° C. for 5 hours.

After 5 hours, 0.2 g of phenyl borate (1.65E-3 mol) was added, and the additional reaction was performed for 1 hour. After 1 hour, the reaction solution was cooled to room temperature, transferred to the separatory funnel of 1 liter to perform extraction using toluene, and desirably washed with distilled water. The toluene layer in the separatory funnel was desirably dried using magnesium sulfate, and then purified using the silica gel chromatography and the reprecipitation.

The dichloromethane/hexane system and the dichloromethane/methanol system were used as the solvent that was used to perform the purification using the reprecipitation.

Thereby, 2.1 g of the light yellow white solid was produced (the yield that meant the recovery amount was 41%).

EL materials 1 and 2 (the compounds for organic EL according to the embodiments of the invention) were used as the light emitting dopant material, and mixed with the host materials for EL (hosts 1, 2, and 3) at a predetermined mixing ratio as described below to form the materials for the light emitting layer of the organic EL device.

The syntheses were performed with reference to the following literatures: Polymers for Advanced Technologies, 15(5), 266-269; 2004 Eur. Pat. Apply, 1298117, Apr. 2, 2003 Helvetica Chimica Acta, 85(7), 2195-2213; 2002 Organometallics, 20(24), 5162-5170; 2001 Journal of Organic Chemistry, 69(3), 987-990; 2004 Advanced Functional Materials, 13(12), 967-973; 2003 Canadian Journal of Chemistry (1992), 70(4), 1015-1021 Synthesis, (2), 131-3; 1980 Journal of Organic Chemistry, 62(3), 530-537; 1997.

Organic EL Device

A description will be given of the organic EL device according to the embodiment of the invention with reference to FIG. 12.

Figure 12:
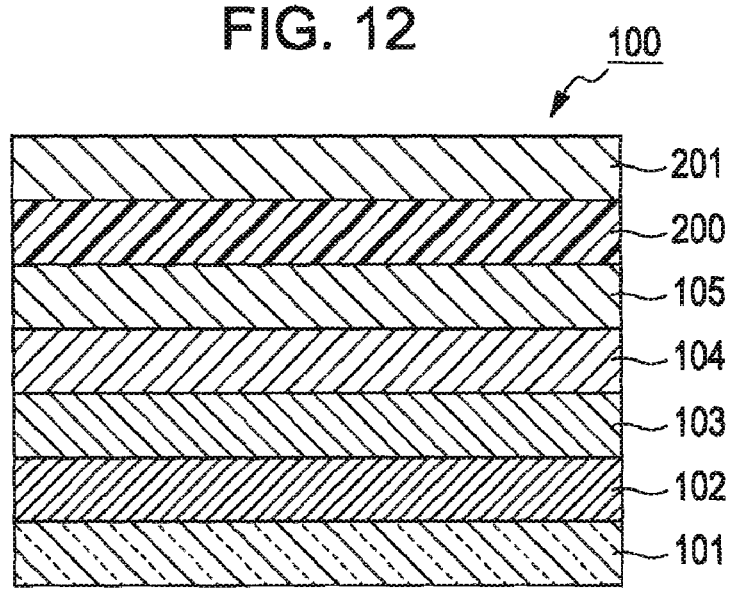
FIG. 12 schematically illustrates an organic EL device according to an embodiment of the invention.

In FIG. 12, reference numeral 100 denotes the organic EL device. The organic EL device 100 includes a light-transmissive anode (a first electrode) 102 and a cathode (a second electrode) 105 on a light-transmissive substrate 101, and a functional layer is interposed between the anode 102 and the cathode 105. A hole injection/transport layer 103 and a light emitting layer 104 are layered to form the functional layer. The organic EL device 103 is a bottom emission type that emits light from the light emitting layer 104 through the light-transmissive substrate 101.

The substrate 101 includes driving elements composed of TFT elements on the transparent substrate such as a glass substrate, or various wires. The anode 102 is formed on the driving elements or the wires while an insulating layer or a planarization film is interposed between the anode and the elements or the wires. The anode 102 is patterned with respect to all pixels formed on the substrate 101, and connected to the driving elements composed of the TFT elements or the wires. In this embodiment, the anode is formed of ITO.

The hole injection/transport layer 103 transports the holes from the anode 102 to the light emitting layer 104, and is formed of 3,4-polyethylenedioxythiophene/polystyrene sulfonic acid (PEDOT/PSS). The light emitting layer 104 is formed of the material containing the compound for organic EL according to the embodiment of the invention. In connection with this, the blue light emitting layer having the light emitting wavelength band of the blue color is provided. Accordingly, the organic EL device 100 displays the blue color.

The cathode 105 is formed to cover all the pixel regions, and LiF, Ca, and Al layers are sequentially layered on the light emitting layer 104 to form the cathode 105. A sealing material 200 is formed on the cathode 105 to attach a sealing substrate 201. The sealing material 200 is made of a thermosetting resin or a UV-curable resin.

A description will be given of a method of producing the organic EL device 100. The method includes an anode forming process, a substrate treating process (plasma treating process), a hole injection/transport layer forming process, a light emitting layer forming process, a cathode forming process, and a sealing process.

Anode Forming Process

A transparent substrate (not shown) formed of, for example, glass was formed, and thin film transistor (TFT) elements or various wires (not shown) were formed on the transparent substrate using a known process. After an interlayer insulating layer or a planarization film was formed an indium tin oxide (ITO) film was formed on the entire surface of the resulting structure using a deposition process, and patterned with respect to all pixels using a photolithography process to produce the pixel electrode (anode) 102. A light-transmissive conductive material may be used as the pixel electrode 102, and indium zinc oxide may be used instead of ITO.

Substrate Treating Process

The glass substrate constituting the anode (pixel electrode) 102 was subjected to ultrasonic washing using a neutral detergent, acetone, or ethanol, drawn from boiled ethanol, and dried. Subsequently, the surface of the transparent electrode was subjected to oxygen plasma treatment at the atmospheric pressure, reformed to have hydrophilicity, and applied to a spin coat holder in the atmosphere.

Hole Injection/Transport Layer Forming Process

The solution of PEDOT/PSS (weight ratio of 1:2.5) dispersed in water (commercial name: BAYTRON P, manufactured by H. C. Starck, Inc.) was applied on the substrate on which the anode (pixel electrode) 102 was formed as the material for forming the hole injection/transport layer using spin coating in the atmosphere, and then dried in a nitrogen atmosphere at 100° C. for 30 minutes to form the hole injection/transport layer 103. After the drying, the layer was 50 nm in thickness.

Light Emitting Layer Forming Process

Mixtures including EL materials 1 and 2 (light emitting dopant material) which were the compound for organic EL according to the first embodiment of the invention and host materials 1, 2, and 3 for EL were produced as the material for forming the light emitting layer 104. As described in the following Table, the mixtures of EL materials 1 and 2 (light emitting dopant material) and host materials 1, 2, and 3 for EL were used in Examples 1 to 6. For comparison, materials including only host materials 1, 2, and 3 for EL were used in Comparative examples 1 to 3.

EL materials 1 and 2 (light emitting dopant material) and host materials 1, 2, and 3 for EL were mixed at a predetermined mixing ratio, and dissolved in a solvent to form solutions (ink) The solutions were applied on the surface of the hole injection transport layer 103 using the spin coating process to the thickness of, for example, 100 nm to form the light emitting layer 104. After the application to form the layer, the drying was performed in a nitrogen atmosphere at 100° C. for 30 minutes. When the layer was formed using the solution, the hole injection/transport layer 103 was not compatible to the solution.

The layer may be formed using the solution by means of the liquid droplet ejecting process (ink jet process) instead of the spin coating process.

Cathode Forming Process

After the light emitting layer 104 was formed, the vacuum was set to $10^{-7}$ to $10^{-8}$ Torr using a vacuum deposition device, and LiF, Ca, and Al were sequentially applied to the thickness of 4, 10, and 200 nm, respectively. The cathode 105 was then formed.

Sealing Process

In the final process, that is, the sealing process, the sealing material 200 including the thermosetting resin or the UV-curable resin was applied on the entire surface of the cathode 105 to form the sealing layer. Additionally, a sealing substrate 201 was attached to the sealing layer (sealing material 200). It is preferable that the sealing process be performed in an inert gas atmosphere including nitrogen, argon, or helium.

The organic EL device 100 of FIG. 12 was produced through the above-referenced procedure.

In the organic EL device 100, when the light emitting layer 104 is formed using the compound for organic EL according to the embodiment of the invention, the luminescence characteristic (luminance) and the reliability (the half-life of luminance) are excellent in comparison with the test results as described below. Accordingly, high efficiency and a long life span of light emission are assured.

Examples 1 to 6 and Comparative Examples 1 to 3

The material of the light emitting layer 104 is described in Table 1:

TABLE 1

|  | Host material | Light emitting material | Chromaticity (CIE1931) | Luminance (cd/m$^2$) (100 mA/cm$^2$) | Required voltage (V) (100 mA/cm$^2$) | Half-life of luminance (hr) (100 mA/cm$^2$) |
|---|---|---|---|---|---|---|
| Example 1 | Host 1 | EL material 1 | (0.13, 0.24) | 8500 | 5.7 | 45 |
| Example 2 | Host 1 | EL material 2 | (0.14, 0.27) | 8700 | 5.7 | 50 |

TABLE 1-continued

|  | Host material | Light emitting material | Chromaticity (CIE1931) | Luminance (cd/m$^2$) (100 mA/cm$^2$) | Required voltage (V) (100 mA/cm$^2$) | Half-life of luminance (hr) (100 mA/cm$^2$) |
| --- | --- | --- | --- | --- | --- | --- |
| Example 3 | Host 2 | EL material 1 | (0.13, 0.24) | 7500 | 5.5 | 60 |
| Example 4 | Host 2 | EL material 2 | (0.14, 0.27) | 7700 | 5.5 | 70 |
| Example 5 | Host 3 | EL material 1 | (0.13, 0.24) | 7000 | 5.4 | 85 |
| Example 6 | Host 3 | EL material 2 | (0.14, 0.27) | 6700 | 5.4 | 80 |
| Comparative example 1 | Host 1 | None | (0.17, 0.14) | 500 | 6.0 | 20 |
| Comparative example 2 | Host 2 | None | (0.16, 0.04) | 650 | 5.8 | 35 |
| Comparative example 3 | Host 3 | None | (0.15, 0.09) | 900 | 5.5 | 45 |

In Example 1, EL material 1 shown in Formula 8 and host 1 shown in Formula 10 were mixed at a mixing ratio (weight ratio) of 1:17, and dissolved in chloroform to produce a solution (ink) containing 1.5 percent by weight of solids. As described above, the light emitting layer 104 was formed using the solution (ink) to produce the organic EL device of Example 1.

In Example 2 EL material 2 shown in Formula 9 and host 1 shown in Formula 10 were mixed at a mixing ratio (weight ratio) of 1:17, and dissolved in chloroform to produce a solution (ink) containing 1.5 percent by weight of solids. As described above, the light emitting layer 104 was formed using the solution (ink) to produce the organic EL device of Example 2.

In Example 3, EL material 1 shown in Formula 8 and host 2 shown in Formula 11 were mixed at a mixing ratio (weight ratio) of 1:17, and dissolved in chloroform to produce a solution (ink) containing 1.5 percent by weight of solids. As described above, the light emitting layer 104 was formed using the solution (ink) to produce the organic EL device of Example 3.

In Example 4, EL material 2 shown in Formula 9 and host 2 shown in Formula 11 were mixed at a mixing ratio (weight ratio) of 1:17, and dissolved in chloroform to produce a solution (ink) containing 1.5 percent by weight of solids. As described above, the light emitting layer 104 was formed using the solution (ink) to produce the organic EL device of Example 4.

In Example 5, EL material 1 shown in Formula 8 and host 3 shown in Formula 12 were mixed at a mixing ratio (weight ratio) of 1:17, and dissolved in chloroform to produce a solution (ink) containing 1.5 percent by weight of solids. As described above, the light emitting layer 104 was formed using the solution (ink) to produce the organic EL device of Example 5.

In Example 6, EL material 2 shown in Formula 9 and host 3 shown in Formula 12 were mixed at a mixing ratio (weight ratio) of 1:17, and dissolved in chloroform to produce a solution (ink containing 1.5 percent by weight of solids. As described above, the light emitting layer 104 was formed using the solution (ink) to produce the organic EL device of Example 6.

In Comparative example 1, only host 1 shown in Formula 10 was dissolved in chloroform to produce a solution (ink) containing 1.5 percent by weight of solids. As described above, the light emitting layer 104 was formed using the solution (ink) to produce the organic EL device of Comparative example 1.

In Comparative example 2, only host 2 shown in Formula 11 was dissolved in chloroform to produce a solution (ink) containing 1.5 percent by weight of solids. As described above, the light emitting layer 104 was formed using the solution (ink) to produce the organic EL device of Comparative example 2.

In Comparative example 3, only host 3 shown in Formula 12 was dissolved in chloroform to produce a solution ink) containing 1.5 percent by weight of solids. As described above, the light emitting layer 104 was formed using the solution (ink) to produce the organic EL device of Comparative example 3.

Evaluation of the Device

Voltage was applied to the organic EL device so that a direct current of 100 mA/cm$^2$ flew through the light emitting layer 104, thereby emitting light.

Figure 13:
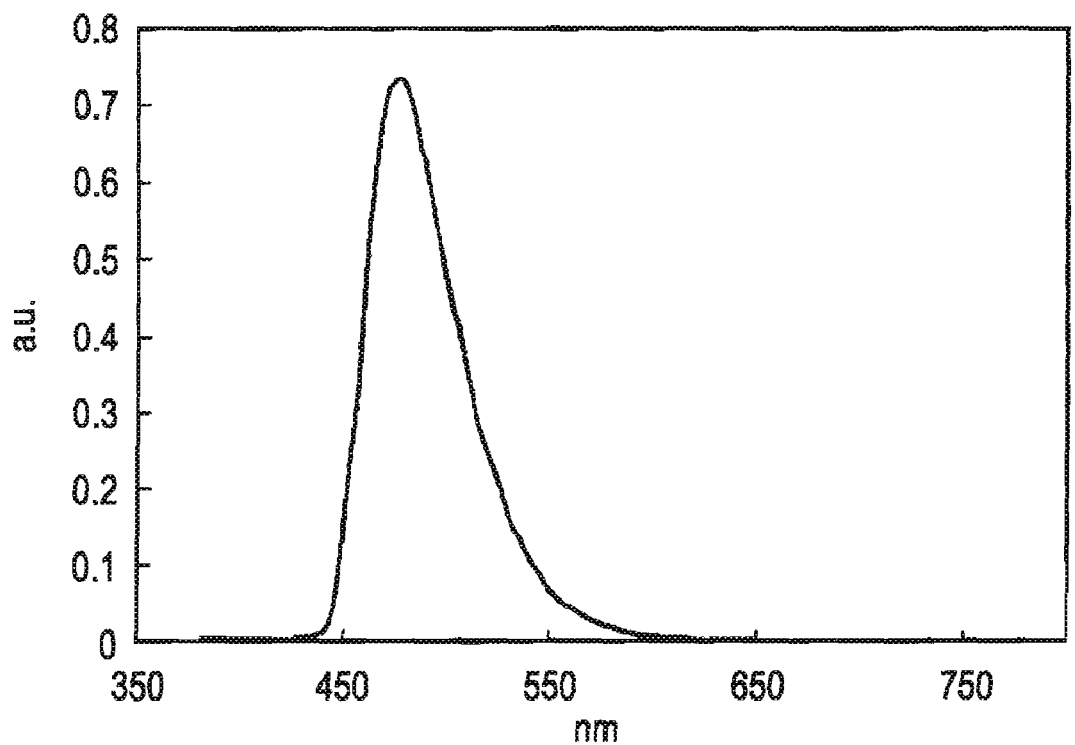
FIG. 13 is a graph showing an EL waveform that is formed by light emission of the organic EL device.
Figure 14:
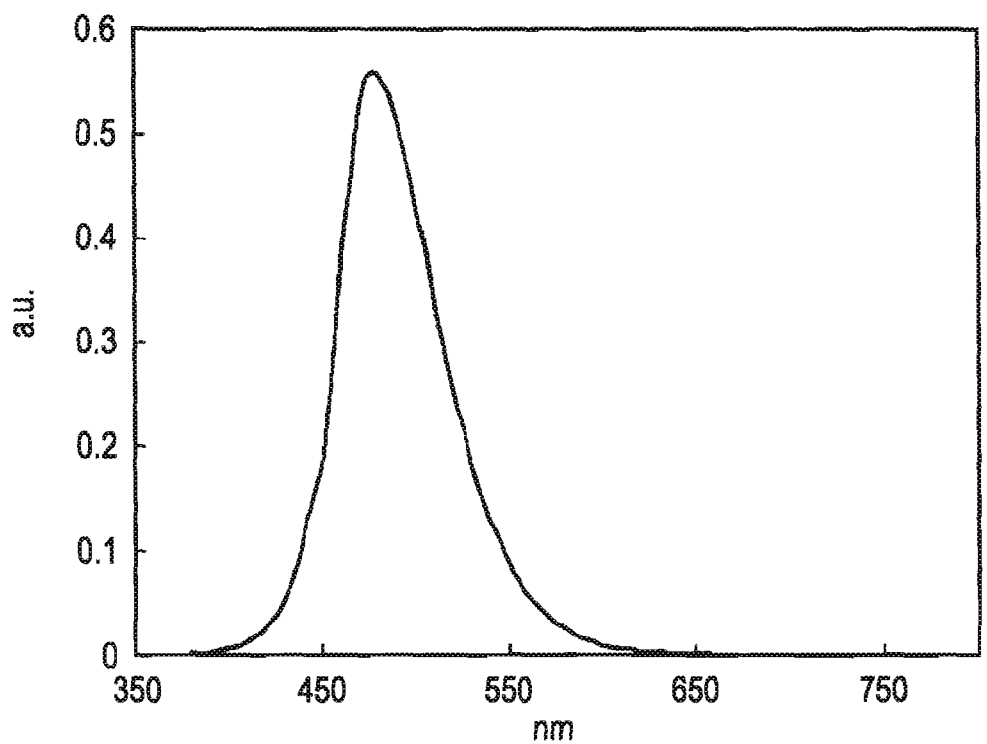
FIG. 14 is a graph showing an EL waveform that is formed by light emission of the organic EL device.
Figure 15:
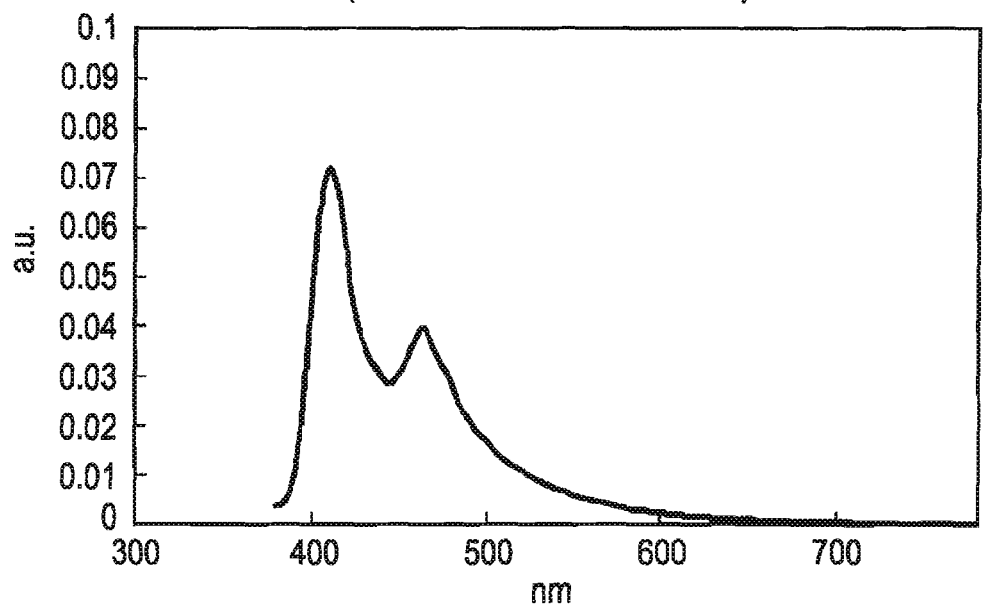
FIG. 15 is a graph showing an EL waveform that is formed by light emission of the organic EL device.
Figure 16:
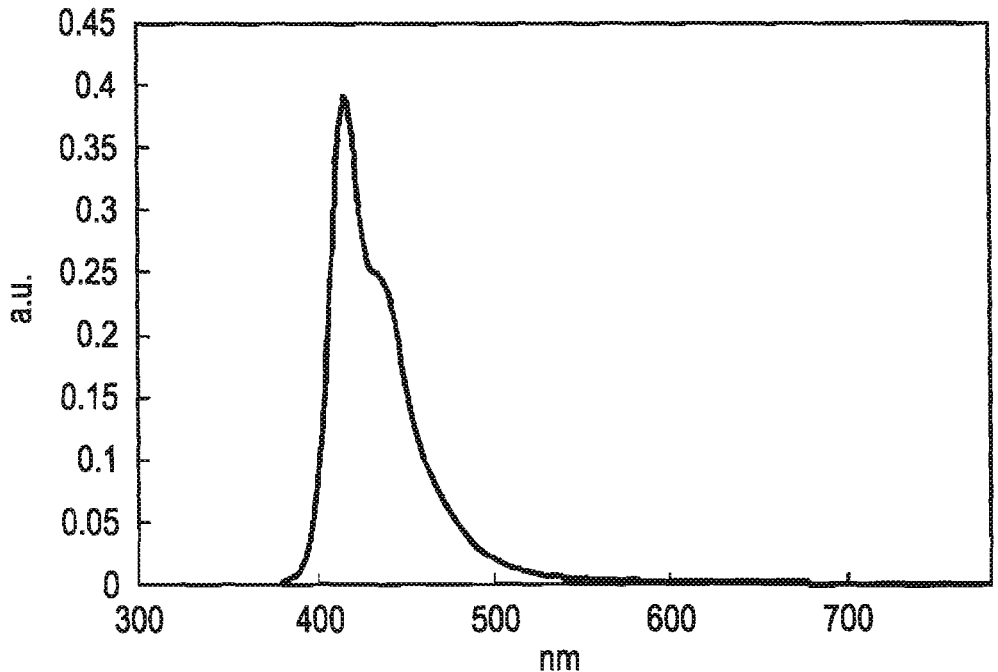
FIG. 16 is a graph showing an EL waveform that is formed by light emission of the organic EL device.
Figure 17:
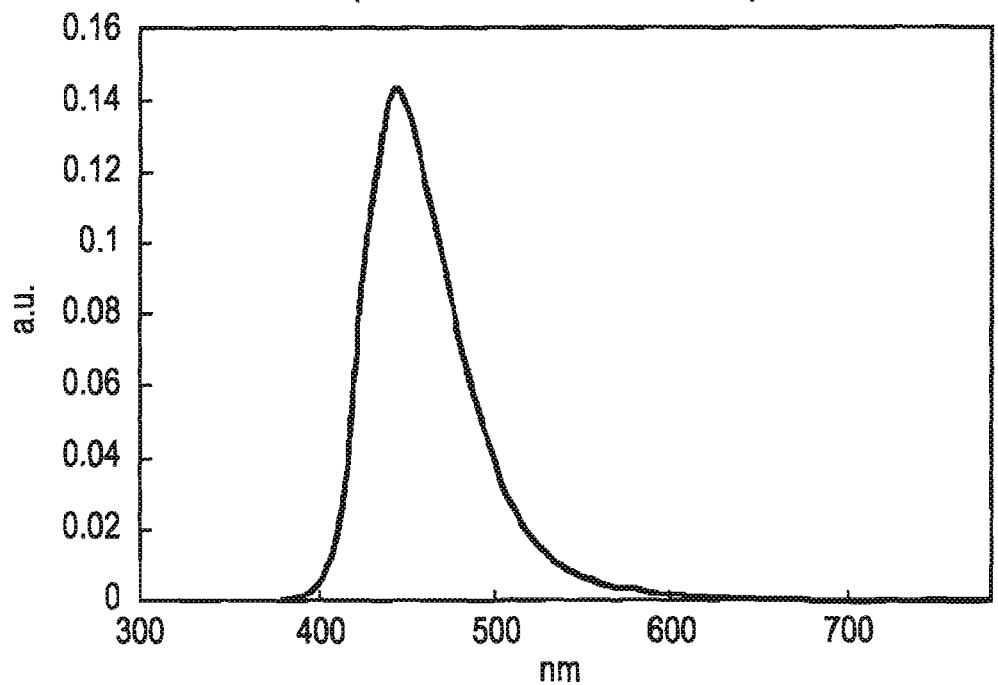
FIG. 17 is a graph showing an EL waveform that is formed by light emission of the organic EL device.

The resulting EL waveforms are shown in FIGS. 13 to 17. FIG. 13 shows the EL waveforms of Examples 1, 3, and 5, FIG. 14 shows the EL waveforms of Examples 2, 4, and 6, FIG. 15 shows the EL waveform of Comparative example 1, FIG. 16 shows the EL waveform of Comparative example 2, and FIG. 17 shows the EL waveform of Comparative example 3.

Chromaticity, luminance, and the half-life of luminance of emitted light (the time required for half of the luminance to vanish with respect to the initial luminance) were measured, and the results are described in Table 1.

In Example 1, a voltage of 5.7 V was applied to generate the current.

A voltage of 5.7 V was applied in Example 2, a voltage of 5.5 V was applied in Example 3, a voltage of 5.5 V was applied in Example 4, a voltage of 5.4 V was applied in Example 5, a voltage of 5.4 V was applied in Example 6, a voltage of 6.0 V was applied in Comparative example 1, a voltage of 5.8 V was applied in Comparative example 2, and a voltage of 5.5 V was applied in Comparative example 3.

From the above results, it can be seen that the organic EL device including the light emitting layer 104 formed using the compound for organic EL according to the aspect of the invention has excellent luminance and the half-life of luminance in comparison with the devices of Comparative examples. Accordingly, the luminescence characteristic (luminance) and the reliability (the half-life of luminance) are excellent. Therefore, the organic EL device according to the aspect of the invention has high efficiency and a long life span in comparison with a known organic EL device.

The entire disclosure of Japanese Patent Application No. 2006-110757, filed Apr. 13, 2006 is expressly incorporated by reference herein.

What is claimed is:

1. A compound for organic electroluminescence that includes a polymer molecule having molecules shown in Formulae 1 to 5 as constituent units:

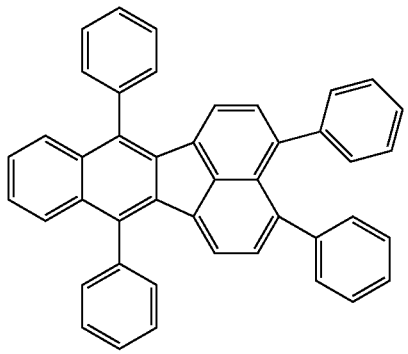
(1)

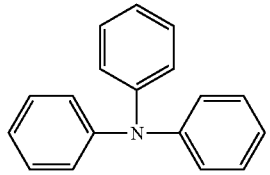
(2)

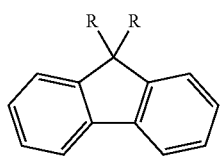
(3)

wherein R is an alkyl group, an aryl group, or an alkylaryl group,

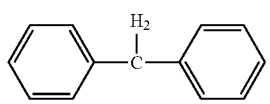
(4)

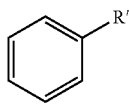
(5)

wherein R' is hydrogen, an alkyl group, or an alkylaryl group, wherein the polymer molecule is expressed by Formula 6:

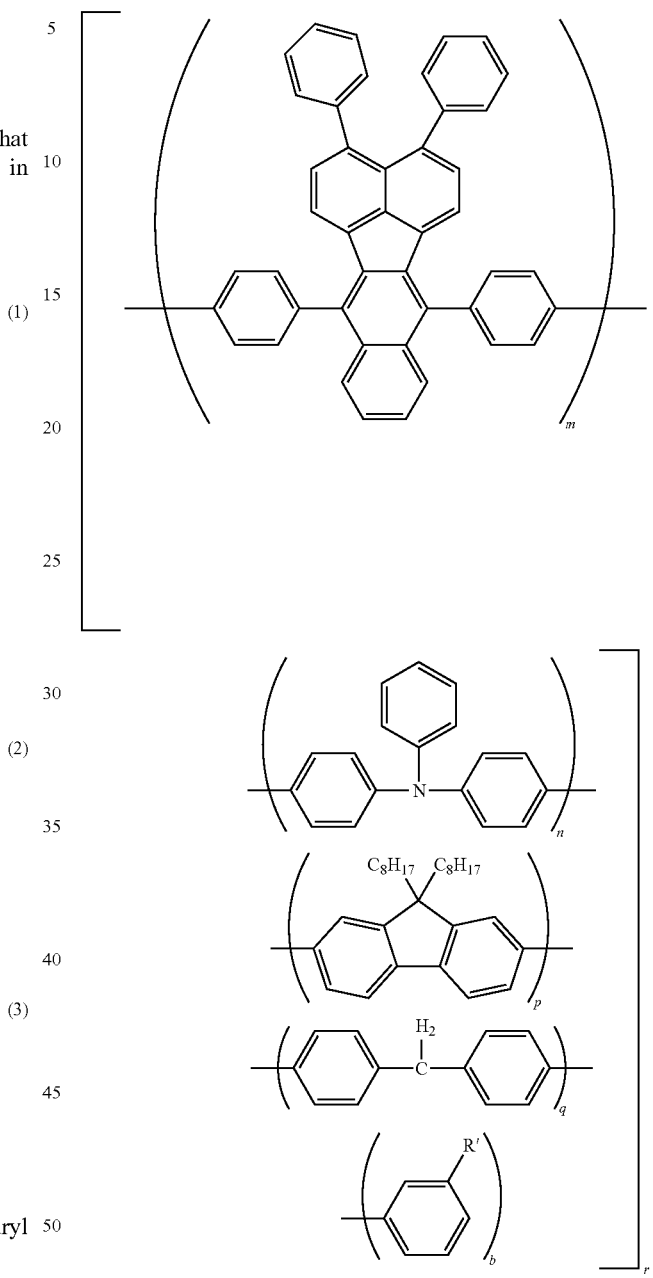
(6)

wherein R is an alkyl group, an aryl group, or an alkylaryl group, R' is hydrogen, an alkyl group, or an alkylaryl group, m, n, and p are each an integer of 1 or more, q and b are each an integer of 0 or more, and r is an integer of 1 or more.

2. The compound for organic electroluminescence according to claim 1, wherein m that is the integer denoting the number of light emitting units of Formula 1 is 1 or 2 in an oligomer unit of Formula 6.

3. The compound for organic electroluminescence according to claim 1, wherein n that is the integer denoting the number of units having a hole trapping ability of Formula 2 is 2 or more in an oligomer unit of Formula 6.

4. The compound for organic electroluminescence according to claim 1,
wherein p that is the integer denoting the number of connection units for polymerization having an electron trapping ability of Formula 3 is 1 to 4 in an oligomer unit of Formula 6.

5. The compound for organic electroluminescence according to claim 1,
wherein a unit of Formula 1 and a unit of Formula 2 are directly connected to each other at one point or more in the structure of an oligomer unit of Formula 6.

6. An organic electroluminescent device comprising the compound for organic electroluminescence according to claim 1.

7. An organic electroluminescent device comprising the compound for organic electroluminescence according to claim 1 applied to a light emitting layer.

8. An organic electroluminescent device comprising the compound for organic electroluminescence according to claim 1 used as a light emitting dopant material of a light emitting layer.

9. The organic electroluminescent device according to claim 8,
wherein the light emitting layer is formed of the light emitting dopant material and a host material so that k shown in Equation 7 is 0.5 to 10.0 percent by weight:

$$k=(a/(b+c))\times 100, \qquad \text{Equation 7}$$

wherein a is the weight of a unit of Formula 1 of the light emitting dopant material, b is the weight of the light emitting dopant material, and c is the weight of the host material.

10. The organic electroluminescent device according to claim 8,
wherein the light emitting layer is formed of the light emitting dopant material and the host material, and
the host material is a homopolymer or a copolymer having at least one material selected from fluorene, arylamine, and anthracene.

11. The organic electroluminescent device according to claim 7,
wherein at least one hole injection or hole transport layer is formed between the light emitting layer and an anode.

12. The organic electroluminescent device according to claim 7,
wherein the light emitting layer is formed through coating using a spin coating process or a liquid droplet ejecting process.

* * * * *